United States Patent
Horng et al.

(12) 
(10) Patent No.: US 6,388,847 B1
(45) Date of Patent: May 14, 2002

(54) SPECULAR SPIN VALVE WITH ROBUST PINNED LAYER

(75) Inventors: Cheng T. Horng, San Jose; Min Li, Fremont; Ru-Ying Tong, San Jose; Rong-Fu Xiao, Fremont, all of CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 09/495,348

(22) Filed: Feb. 1, 2000

(51) Int. Cl.[7] .............................. G11B 5/39; H04R 31/00
(52) U.S. Cl. ............................... 360/324.11; 29/603.14
(58) Field of Search ........................ 29/603.07, 603.14; 428/692, 693; 360/324.11, 324.1; 338/32 R; 324/252, 207.21

(56) References Cited

U.S. PATENT DOCUMENTS

| | | | |
|---|---|---|---|
| 5,465,185 A | * 11/1995 | Heim et al. ............ 324/207.21 |
| 5,583,725 A | * 12/1996 | Coffey et al. ................ 324/252 |
| 5,701,223 A | 12/1997 | Fontana, Jr. et al. ......... 360/113 |
| 5,898,549 A | 4/1999 | Gill .............................. 360/113 |
| 5,920,446 A | 7/1999 | Gill .............................. 360/113 |
| 6,181,534 B1 | * 1/2001 | Gill ........................ 360/324.11 |
| 6,219,208 B1 | * 4/2001 | Gill .......................... 360/324.1 |
| 6,282,068 B1 | * 8/2001 | Pinarbasi ............... 360/324.11 |
| 6,317,298 B1 | * 11/2001 | Gill ........................ 360/324.11 |

FOREIGN PATENT DOCUMENTS

JP    11232617 A  *  8/1999  ........... G11B/05/39

* cited by examiner

*Primary Examiner*—William Klimowicz
(74) *Attorney, Agent, or Firm*—George O. Saile; Stephen B. Ackerman

(57) ABSTRACT

A specular spin valve structure that is more robust than currently available specular spin valves is described. The improved stability is achieved by a using a modified pinned layer that is a laminate of three layers—a layer nickel-chromium, between about 3 and 4 Angstroms thick, sandwiched between two layers of cobalt-iron. A key requirement is that the cobalt-iron layer closest to the copper separation layer must be about twice as thick as the other cobalt-iron layer. A process for manufacturing this structure is also disclosed.

20 Claims, 4 Drawing Sheets

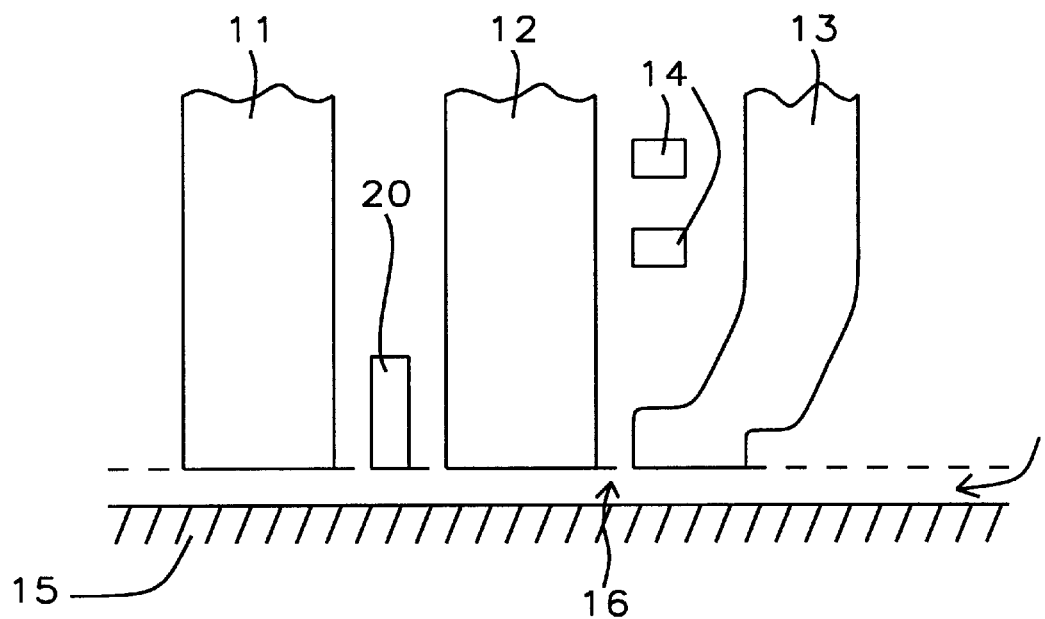
FIG. 1 – Prior Art
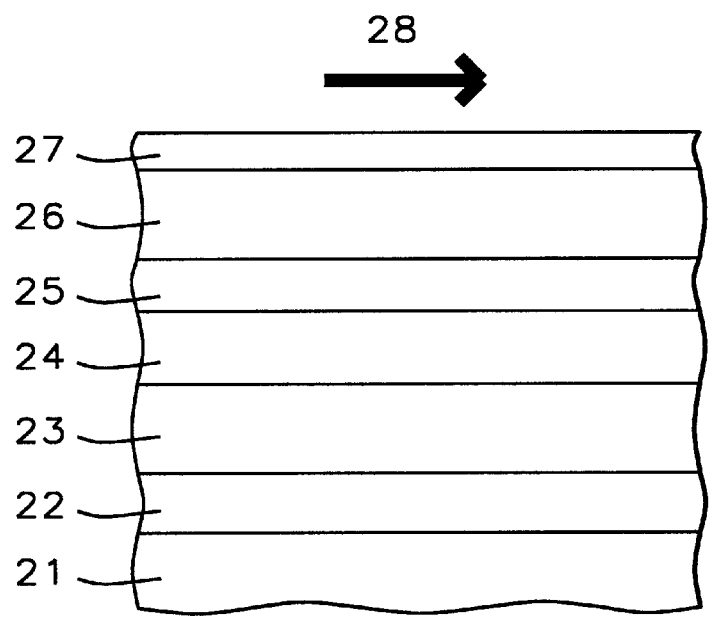
FIG. 2 – Prior Art

SPECULAR SPIN VALVE WITH ROBUST PINNED LAYER

FIELD OF THE INVENTION

The invention relates to the general field of magnetic disk systems with particular reference to GMR based read heads.

BACKGROUND OF THE INVENTION

Read-write heads for magnetic disk systems have undergone substantial development during the last few years. In particular, older systems in which a single device was used for both reading and writing, have given way to configurations in which the two functions are performed by different structures. An example of such a read-write head is schematically illustrated in FIG. 1. The magnetic field that 'writes' a bit at the surface of recording medium 15 is generated by a flat coil, two of whose windings 14 can be seen in the figure. The magnetic flux generated by the flat coil is concentrated within pole pieces 12 and 13 which, while being connected at a point beyond the top edge of the figure, are separated by small gap 16. Thus, most of the magnetic flux generated by the flat coil passes across this gap with fringing fields extending out for a short distance where the field is still powerful enough to magnetize a small portion of recoding medium 15.

The present invention is directed towards the design of read element 20 which can be seen to be a thin slice of material located between magnetic shields 11 and 12 (12 doing double duty as a pole piece, as just discussed). The principle governing the operation of read sensor 20 is the change of resistivity of certain materials in the presence of a magnetic field (magneto-resistance). In particular, most magnetic materials exhibit anisotropic behavior in that they have a preferred direction along which they are most easily magnetized (known as the easy axis). The magneto-resistance effect manifests itself as an increase in resistivity when the material is magnetized in a direction perpendicular to the easy axis, said increase being reduced to zero when magnetization is along the easy axis. Thus, any magnetic field that changes the direction of magnetization in a magneto-resistive material can be detected as a change in resistance.

It is now known that the magneto-resistance effect can be significantly increased by means of a structure known as a spin valve. The resulting increase (known as Giant magneto-resistance or GMR) derives from the fact that electrons in a magnetized solid are subject to significantly less scattering by the lattice when their own magnetization vectors (due to spin) are parallel (as opposed to anti-parallel) to the direction of magnetization of the solid as a whole.

The key elements of a spin valve structure are shown in FIG. 2. In addition to a seed layer 22 on a substrate 21 and a topmost cap layer 27, these key elements are two magnetic layers 23 and 25, separated by a non-magnetic layer 24. The thickness of layer 24 is chosen so that layers 23 and 25 are sufficiently far apart for exchange effects to be negligible (the layers do not influence each other's magnetic behavior at the atomic level) but are close enough to be within the mean free path of conduction electrons in the material. If, now, layers 23 and 25 are magnetized in opposite directions and a current is passed though them along the direction of magnetization (such as direction 28 in the figure), half the electrons in each layer will be subject to increased scattering while half will be unaffected (to a first approximation). Furthermore, only the unaffected electrons will have mean free paths long enough for them to have a high probability of crossing over from 23 to 25 (or vice versa). However, once these electron 'switch sides', they are immediately subject to increased scattering, thereby becoming unlikely to return to their original side, the overall result being a significant increase in the resistance of the entire structure.

In order to make use of the GMR effect, the direction of magnetization of one the layers 23 and 25 is permanently fixed, or pinned. In FIG. 2 it is layer 25 that is pinned. Pinning is achieved by first magnetizing the layer (by depositing and/or annealing it in the presence of a magnetic field) and then permanently maintaining the magnetization by over coating with a layer of antiferromagnetic material, or AFM, (layer 26 in the figure). Layer 23, by contrast, is a "free layer" whose direction of magnetization can be readily changed by an external field (such as that associated with a bit at the surface 15 of a magnetic disk).

The structure shown in FIG. 2 is referred to as a top spin valve because the pinned layer is at the top. It is also possible to form a 'bottom spin valve' structure where the pinned layer is deposited first (immediately after the seed and pinning layers). In that case the cap layer would, of course, be over the free layer. The present invention is further directed to a type of spin valve that we refer to as a "specular spin valve" because the conduction electrons are specularly reflected at the NiCr/NiFe interface. We have found, however, that specular spin valves as known to the prior art, for example:

NiCr55/NiFe65/CoFe10/Cu24/CoFe20/MnPt200/NiCr50 (where the numbers represent layer thicknesses in Angstroms and CoFe20 is the pinned layer)

while exhibiting almost twice the GMR effect of non-specular spin valve structures, had lower production yields due to ESD (electrostatic discharge) damage as well as higher scatter in signal amplitude and greater sensitivity to temperature. Thus there exists a need for a specular spin valve that is more robust than those currently known to the art.

A routine search of the prior art was conducted. While several references to various laminated structures within spin valves were encountered, none of these deal with specular spin valves and how to make them more robust. Several of the references found were, however, of interest. For example, Fontana, Jr. et al. (U.S. Pat. No. 5,701,223) forms a pinned layer by strongly coupling two ferromagnetic films in an antiferromagnetic configuration i.e. the two films have a relative antiparallel orientation. The magnetic moments of the two ferromagnetic layers are required to be almost the same. Under these conditions, a pinning layer of nickel oxide may be used and this has the advantage that a cap layer is no longer needed.

Gill (U.S. Pat. No. 5,898,549) forms a pinned layer from three separate pinned layers. The first of these is formed on the pinning layer and, together with the second pinned layer is formed of a high resistivity material such as NiFeCr. They are separated by an anti-parallel coupling layer. The third pinned layer is of low resistivity material such as cobalt.

In U.S. Pat. No. 5,920,446, Gill describes a laminated free layer formed from two ferromagnetic layers separated by a non-magnetic, conducting spacer layer. A key feature is that the two outer layers of the laminate are coupled in an anti-parallel configuration. This arrangement allows the device to operate without a pinned (or pinning) layer.

SUMMARY OF THE INVENTION

It has been an object of the present invention to provide a specular spin valve structure that has greater thermal stability of the pinned layer at high reverse fields than specular spin valves of the prior art.

Another object of the invention has been to improve production yields by reducing losses due to ESD damage.

A further object of the invention has been that said spin valve structures exhibit lower scatter in signal amplitudes than specular spin valves of the prior art.

A still further object of the invention has been to provide a process for manufacturing said spin valve structure.

These objects have been achieved by a using a modified pinned layer that is a laminate of three layers—a layer nickel-chromium, between about 3 and 4 Angstroms thick, sandwiched between two layers of cobalt-iron. A key requirement is that the cobalt-iron layer closest to the copper separation layer must be about twice as thick as the other cobalt-iron layer. A process for manufacturing this structure is also disclosed.

BRIEF DESCRIPTION OF THE DRAWINGS

FIG. 1 is a schematic cross-section of a read-write head for a magnetic disk system.

FIG. 2 is a cross-section of a spin valve structure formed according to the teachings of the prior art.

DESCRIPTION OF THE PREFERRED EMBODIMENTS

Figure 3:
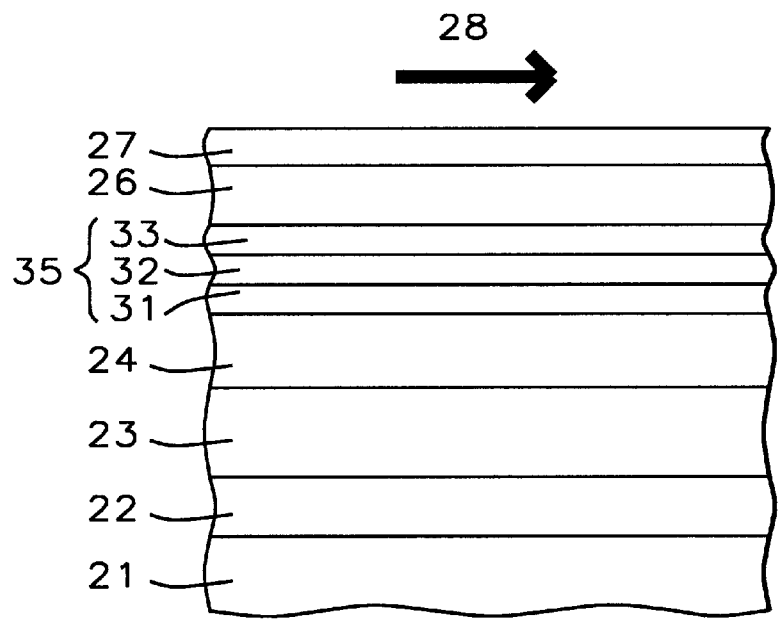
FIG. 3 is a cross-section of a spin valve structure formed according to the teachings of the present invention.

Referring now to FIG. 3, we show there a schematic cross-section of a top spin valve structure that embodies the present invention. A comparison with FIG. 2 of the prior art will reveal that the key novel feature of the invention is the insertion of an additional layer within the pinned layer. What had been pinned layer 25 in the structure shown in FIG. 2 has been replaced by pinned layer 35 which is a laminate of layers 31, 32, and 33. A key feature of the invention is that, for the pinned layer (35), the center layer (32) should be nickel-chromium between about 3 and 4 Angstroms thick, the lower layer (31) should be cobalt-iron, between about 10 and 15 Angstroms thick, and the top layer (33) should also be cobalt iron, between about 5 and 7 Angstroms thick. Additionally, for the structure to function properly, the thickness of layer 31 should be about twice the thickness of layer 33.

We now provide a description of a process for manufacturing the spin valve of the present invention which begins with the provision of suitable substrate 21 (as seen in FIG. 3). Examples of suitable substrate materials include aluminum oxide and silicon oxide.

Next, seed layer 22 is deposited onto substrate 21. This is a magneto-resistance enhancing layer. It consists of a layer of nickel-chromium or nickel-iron-chromium and has a thickness between about 40 and 60 Angstroms. Layer 22, as well as all subsequent layers, was deposited by means of DC-magnetron sputtering. The use of this material (instead of, for example, tantalum) is essential if the structure is to exhibit specular reflection at the interfaces.

The next layer to be laid down is free layer 23. This is depicted in FIG. 3 as a single layer but, in actuality, it is made up of a layer of nickel-iron, between about 30 and 75 Angstroms thick, in contact with layer 22, followed by a layer of cobalt-iron which is between about 3 and 10 Angstroms thick.

Copper layer 24, between about 18 and 25 Angstroms thick, is then deposited over free layer 23.

This is followed by the key step of forming laminated pinned layer 35. First, layer 31 of cobalt-iron, between about 10 and 15 Angstroms thick, is deposited on the copper layer 24. Then, a layer of nickel-chromium 32, between about 3 and 4 Angstroms thick, is deposited onto layer 31. Finally, layer 33, also of cobalt iron and having a thickness between about 5 and 7 Angstroms, is deposited on layer 32. Within the ranges just given, the relative thicknesses of layers 31 and 33 must be about 2:1.

The structure is completed by depositing pinning layer 26 (which is a layer of manganese-platinum between about 150 and 250 Angstroms thick) on laminated pinned layer 35. This is followed by the deposition of cap layer 27 which is nickel-chromium having a thickness between about 30 and 50 Angstroms. The cap layer is needed to keep the CoFe from oxidizing during annealing.

Figure 4:
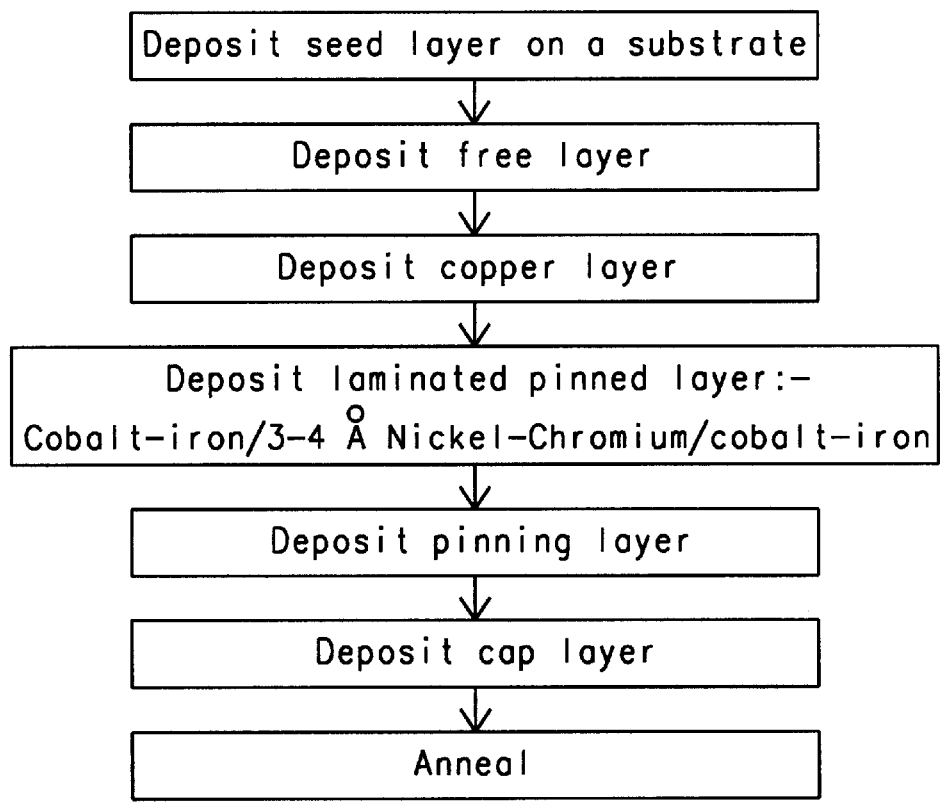
FIG. 4 is a flowchart summary of the process of the present invention.

The process of the present invention ends with said annealing step. The structure of FIG. 3 is heated to a temperature between about 250 and 300° C. for between about 3 and 5 hours in the presence of a magnetic field whose strength is between about 1,500 and 2,500 oe. A summary of the process of the invention in flow chart form is given in FIG. 4.

Note that the compositions of the various alloys mentioned in the above description are (in atomic) %:
  nickel-iron 80% nickel; nickel-chromium 60% nickel; nickel-iron-chromium 48% nickel & 40% chromium; cobalt-iron 90% cobalt; and manganese-platinum 55% manganese.

Experimental confirmation of the effectiveness of the present invention was obtained through the formation of several spin valve structures according to the teachings of the present invention. The results are summarized in TABLE I below:

TABLE I

| Structure | $B_s$ | $H_c$ | $H_e$ | $H_k$ | $R_s$ | $\Delta R/R$ | $\Delta R$ | $\Delta R/\Delta R$ (Ta) |
|---|---|---|---|---|---|---|---|---|
| Ta75/NiFe65/CoFe10/Cu30/CoFe20/MP200/Ta50 | 0.67 | 4.35 | 8.0 | 13.4 | 12.7 | 6.01 | 0.77 | 1.00 |
| NiCr55/NiFe60/CoFe3/Cu24/CoFe20/MP200/NiCr50 | 0.55 | 5.04 | 5.7 | 7.6 | 12.6 | 9.85 | 1.24 | 1.61 |
| NiCr55/NiFe60/CoFe3/Cu24/CoFe15/MP200/NiCr50 | 0.55 | 4.70 | 5.0 | 5.4 | 13.6 | 8.84 | 1.20 | 1.56 |
| NiCr55/NiFe60/CoFe3/Cu24/CoFe13/NiCr3/CoFe7/MP200/NiCr50 | 0.53 | 6.18 | 7.2 | 9.3 | 13.4 | 8.03 | 1.07 | 1.39 |
| NiCr55/NiFe60/CoFe3/Cu24/CoFe10/NiCr3/CoFe5/MP200/NiCr50 | 0.53 | 4.96 | 4.9 | 5.5 | 13.6 | 6.75 | 0.92 | 1.19 | where $B_s$ = magnetic moment, $H_c$ = free layer coercivity (oe), $H_e$ = inter-layer coupling field, $H_k$ = anisotropy field (oe), $R_s$ = sheet resistance (ohm/sq.), $\Delta R/R$ = GMR ratio, $\Delta R$ = resistance change due to GMR effect, and $\Delta R/\Delta R$(Ta) = resistance change relative to a non-specular structure.

In TABLE I, the first row is for a non-specular spin valve. The next two rows are for specular spin valve structures of the prior art, while the last two rows are examples of specular spin valves formed according to the teachings of the present invention. As can be seen, the substitution of a laminated pinned layer of the present invention for a conventional one did reduce AR somewhat relative to conventional specular spin valves. However, this loss in performance was more than made up by the improved robustness of the new structure as illustrated in FIGS. 5 and 6.

Figure 5:
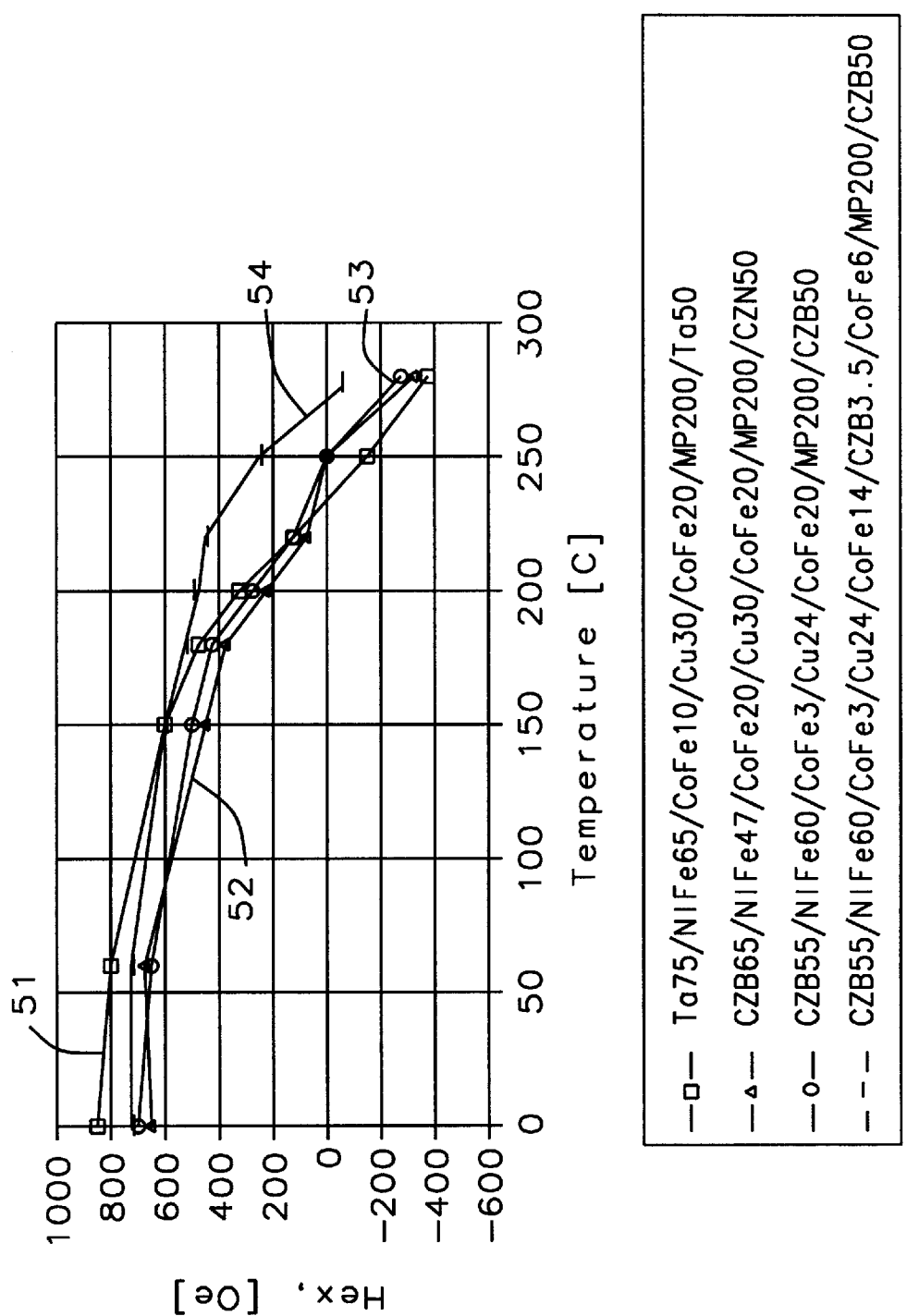
FIG. 5 compares stability of the pinned field as a function of annealing temperature for spin valve structures of the prior art with spin valves of the present invention.

FIG. 5 plots Hex (exchange bias field strength in CoFe/AFM) in oersted as a function of annealing temperature (30 minutes in a field of 2,000 gauss). Curve 51 is for a non-specular structure, curves 52 and 53 are for specular structures of the prior art, while curve 54 is for a specular spin valve based on the present invention. As can be seen, the structures of the prior art show a more rapid drop in $H_{ex}$ for temperatures greater than about 150° C. relative to the structure based on the present invention. Note that CZB=NiCr and CZN=NiFeCr. The blocking temperature for the structure of the present invention is around 275° C. (curve 54), about 50° C. higher than for the Ta based GMR structure.

Figure 6:
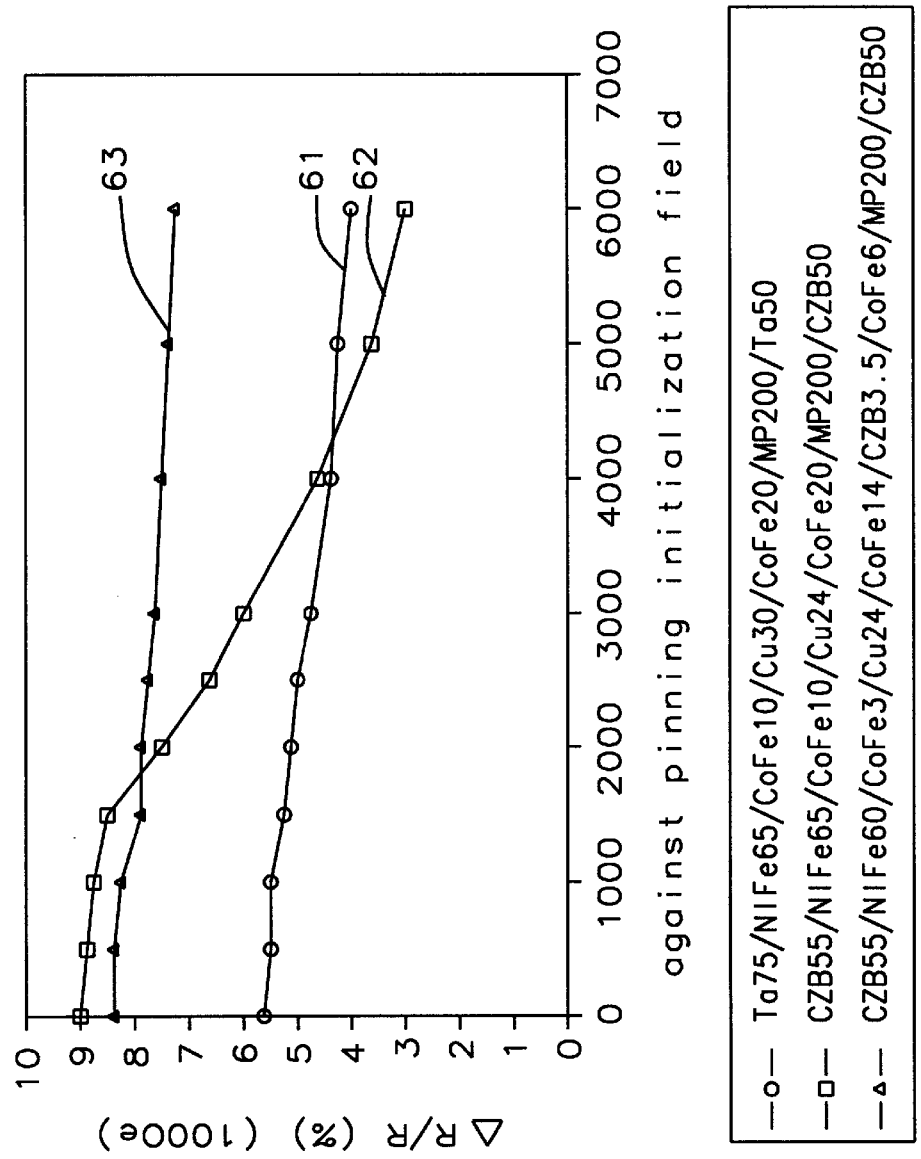
FIG. 6 compares the GMR ratio as a function of the "against pinning initialization field" for spin valve structures of the prior art with spin valves of the present invention.

FIG. 6 is a plot of ΔR/R (measured at 100 oe and expressed as %) as a function of the "against pinning initialization field" (in oersted). This term refers to the practice of applying a high initialization field of about 7,000 oe to reverse the pinned layer direction and then measuring ΔR/R as a function of a field applied in the opposite direction to this initialization field. Curve 61 is for a non-specular spin valve, curve 62 is a specular spin valve of the prior art, and curve 63 is for a spin valve formed according to the teachings of the present invention. While the non-specular and the disclosed structures both exhibit relatively little dependence on the against field, with the disclosed structure having a significantly better ΔR/R, the performance of the specular structure of the prior art is seen to degrade significantly when the against field exceeds about 2,000 showing that its associated pinned layer is less robust than that which is associated with the present invention.

While the invention has been particularly shown and described with reference to the preferred embodiments thereof, it will be understood by those skilled in the art that various changes in form and details may be made without departing from the spirit and scope of the invention.

What is claimed is:

1. A process for manufacturing a spin valve structure, comprising:
   providing a substrate;
   on said substrate, depositing a magneto-resistance enhancing seed layer;
   depositing a free layer that further comprises a first layer of nickel-iron on the magneto-resistance enhancing seed layer and a first layer of cobalt-iron on the first nickel-iron layer;
   depositing a layer of copper on the free layer;
   depositing a laminated pinned layer that further comprises a second layer of cobalt-iron, between about 10 and 15 Angstroms thick, on the copper layer, a layer nickel-chromium, between about 3 and 4 Angstroms thick, on the second layer of cobalt-iron, and a third layer of cobalt iron, between about 5 and 7 Angstroms thick, on the layer of nickel-chromium, whereby the thickness of said second layer of cobalt-iron is about twice the thickness of the third layer of cobalt-iron;
   depositing a pinning layer on the laminated pinned layer;
   depositing a cap layer on the pinning layer; and
   then annealing.

2. The process of claim 1 wherein the substrate is selected from the group consisting of aluminum oxide and silicon oxide.

3. The process of claim 1 wherein the step of depositing a magneto-resistance enhancing seed layer further comprises depositing a layer of nickel-chromium or a layer of nickel-iron-chromium, to a thickness between about 45 and 60 Angstroms.

4. The process of claim 1 wherein, when forming the free layer, the first layer of nickel-iron is deposited to a thickness between about 30 and 75 Angstroms and the first layer of cobalt-iron is deposited to a thickness between about 3 and 10 Angstroms.

5. The process of claim 1 wherein the copper layer is deposited to a thickness between about 18 and 25 Angstroms.

6. The process of claim 1 wherein the step of depositing a pinning layer further comprises depositing a layer of manganese-platinum to a thickness between about 150 and 250 Angstroms.

7. The process of claim 1 wherein the step of depositing a cap layer further comprises depositing a layer of nickel-chromium or nickel-iron-chromium to a thickness between about 30 and 50 Angstroms.

8. The process of claim 1 wherein the step of annealing further comprises heating to a temperature between about 250 and 300° C. for between about 3 and 5 hours.

9. A pinned layer laminate, forming part of a specular spin valve structure, comprising: a first layer of cobalt-iron, between about 10 and 15 Angstroms thick:
   a layer of nickel-chromium, between about 3 and 4 Angstroms thick, on said first layer of cobalt-iron; and
   a second layer of cobalt-iron, between about 5 and 7 Angstroms thick, on the layer of nickel-chromium, whereby the thickness of said first layer of cobalt-iron is about twice the thickness of said second layer of cobalt-iron.

10. The pinned layer of claim 9 wherein said layers of cobalt-iron contain between about 85 and 95 atomic % cobalt.

11. The pinned layer of claim 9 wherein said layer of nickel-chromium contains between about 50 and 60 atomic % nickel.

12. A spin valve structure, comprising:
   a substrate;
   on said substrate, a magneto-resistance enhancing seed layer;
   a free layer that further comprises a first layer of nickel-iron on the magneto-resistance enhancing seed layer and a first layer of cobalt-iron on the first nickel-iron layer;
   a layer of copper on the free layer;
   a laminated pinned layer that further comprises a second layer of cobalt-iron, between about 10 and 15 Angstroms thick, on the copper layer, a layer of nickel-chromium, between about 3 and 4 Angstroms thick, on the second layer of cobalt-iron, and a third layer of cobalt iron, between about 5 and 7 Angstroms thick, on the layer of nickel-chromium, whereby the thickness of said second layer of cobalt-iron is about twice the thickness of the third layer of cobalt-iron;

a pinning layer on the laminated pinned layer; and a cap layer on the pinning layer.

13. The spin valve structure of claim 12 wherein the substrate is selected from the group consisting of aluminum oxide and silicon oxide.

14. The spin valve structure of claim 12 wherein the magneto-resistance enhancing seed layer further comprises a layer, between about 45 and 60 Angstroms thick, of nickel-chromium or nickel-iron-chromium.

15. The spin valve structure of claim 12 wherein the first layer of nickel-iron has a thickness between about 30 and 75 Angstroms and the first layer of cobalt-iron has a thickness between about 3 and 10 Angstroms.

16. The spin valve structure of claim 12 wherein the copper layer has a thickness between about 18 and 25 Angstroms.

17. The spin valve structure of claim 12 wherein the pinning layer is manganese-platinum and has a thickness between about 150 and 250 Angstroms.

18. The spin valve structure of claim 12 wherein the cap layer is nickel-chromium and has a thickness between about 30 and 50 Angstroms.

19. The spin valve structure described in claim 12 wherein said layers of cobalt-iron, that are in the laminated pinned layer, contain between about 85 and 95 atomic % cobalt.

20. The spin valve structure described in claim 12 wherein said layer of nickel-chromium, that is in the laminated pinned layer, contains between about 50 and 60 atomic % nickel.

* * * * *